United States Patent [19]

Ley

[11] Patent Number: 4,904,955
[45] Date of Patent: Feb. 27, 1990

[54] CIRCUIT FOR GENERATING TWO CLOSELY ADJACENT FREQUENCIES

[75] Inventor: Manfred Ley, Villach, Austria

[73] Assignee: Siemens Aktiengesellschaft, Munich, Fed. Rep. of Germany

[21] Appl. No.: 240,947

[22] Filed: Sep. 6, 1988

[30] Foreign Application Priority Data

Sep. 11, 1987 [DE] Fed. Rep. of Germany ....... 3730645

[51] Int. Cl.$^4$ .............................................. H03L 7/00
[52] U.S. Cl. ......................................... 331/2; 331/25; 331/57
[58] Field of Search ..................... 331/2, 18, 25, 46, 57

[56] References Cited

U.S. PATENT DOCUMENTS 4,097,816 6/1978 Imazeki et al. ........................ 331/2

Primary Examiner—Eugene R. Laroche
Assistant Examiner—Robert J. Pascal
Attorney, Agent, or Firm—Herbert L. Lerner; Laurence A. Greenberg

[57] ABSTRACT

A circuit for generating two closely adjacent frequencies includes two oscillators each generating one of two closely adjacent frequencies. A PLL circuit is connected to the oscillators for regulating the frequencies. The PLL circuit performs a frequency comparison of the frequency generated by only one of the oscillators with a reference frequency to generate a frequency comparison output signal of the PLL circuit, and it regulates the frequencies of both of the oscillators as a function of the frequency comparison output signal of the PLL circuit.

3 Claims, 1 Drawing Sheet

FROM COMPARISON STAGE

CIRCUIT FOR GENERATING TWO CLOSELY ADJACENT FREQUENCIES

BACKGROUND OF THE INVENTION:

Field of the Invention:

The invention relates to a circuit for generating two closely adjacent frequencies, having two oscillators each generating one of the two frequencies, and a PLL circuit for regulating the frequencies, the PLL circuit performing a frequency comparison of at least one of the two frequencies with a reference frequency and regulating the frequencies of the two oscillators as a function of a frequency comparison output signal of the PLL circuit.

Closely adjacent frequencies, in other words frequencies which are located close to one another, are used, for example, in data scanning, in zero passage determination of data signals, or in retrieval of timing signals. An example of a value for such a frequency is a first clock frequency of 160.0 MHz and a second clock frequency that is higher by 0.1 to 0.8%.

Such frequencies have thus far been generated by using two PLL circuits (phase lock loop circuits) having two highly stable quartz oscillators for generating two reference frequencies for the regulation of two oscillators that generate the desired closely adjacent frequencies. If a circuit of this kind is to be used as part of a very large scale integrated circuit, then such a structure is unsuitable, because of the number of external components required as well as because of the space it occupies and the current it consumes.

SUMMARY OF THE INVENTION:

It is accordingly an object of the invention to provide a circuit for generating two closely adjacent frequencies, which overcomes the hereinafore-mentioned disadvantages of the heretofore-known devices of this general type and which is suitable for use in VLS integrated circuits.

With the foregoing and other objects in view there is provided, in accordance with the invention, a circuit for generating two closely adjacent frequencies, comprising two oscillators each generating one of two closely adjacent frequencies, and a PLL circuit connected to the oscillators for regulating the frequencies, the PLL circuit including means for performing a frequency comparison of the frequency generated by only one of the oscillators with a reference frequency to generate a frequency comparison output signal of the PLL circuit, and for regulating the frequencies of both of the oscillators as a function of the frequency comparison output signal of the PLL circuit.

In accordance with another feature of the invention, the oscillators are ring oscillators formed by ECL inverters.

In accordance with a further feature of the invention, there are provided means for defining the frequencies of the ring oscillators formed by ECL inverters with a dissimilar value of a frequency-determining magnitude, and means for regulating the frequencies by adjusting the value of the frequency-determining magnitude through the frequency comparison output signal of the PLL circuit.

In accordance with an added feature of the invention, the ring oscillators have an emitter follower with a delay capacitor forming the frequency-determining magnitude, and the regulation by the frequency comparison output signal of the PLL circuit is in the form of a regulation of the current of the emitter follower.

In accordance with an a concomitant feature of the invention, the ring oscillators are electrically and geometrically identical and symmetrical in an integrated circuit.

Other features which are considered as characteristic for the invention are set forth in the appended claims.

Although the invention is illustrated and described herein as embodied in a circuit for generating two closely adjacent frequencies, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
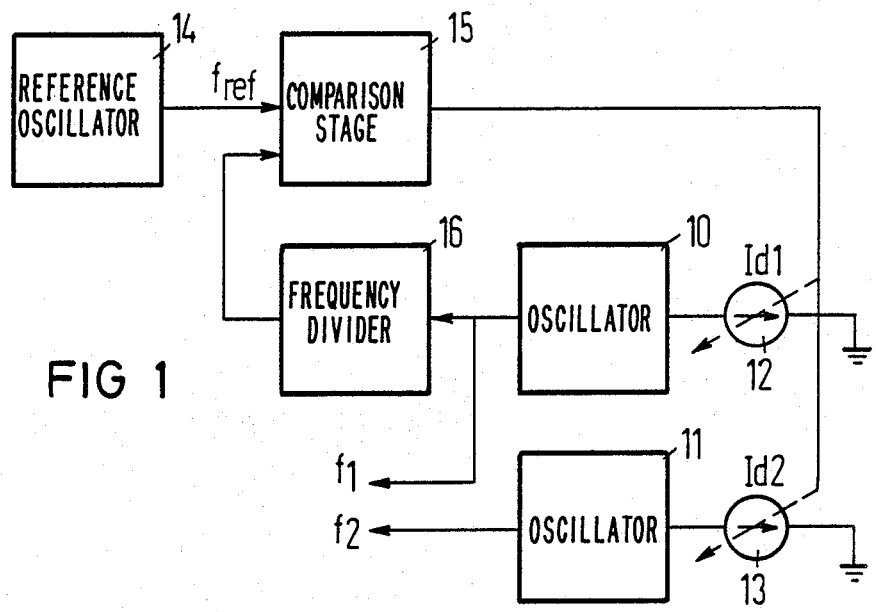
FIG. 1 is a schematic and a block circuit diagram of a general embodiment of a circuit according to the invention.

DESCRIPTION OF THE PREFERRED EMBODIMENTS:

Referring now to the figures of the drawing in detail and first, particularly, to FIG. 1 thereof, there is seen a circuit having two oscillators 10 and 11 which are provided for generating two closely adjacent frequencies $f_1$ and $f_2$. Schematically illustrated frequency-determining circuit portions Id1 and Id2 belonging to the two respective oscillators 10 and 11 regulate the oscillators in a manner to be described below.

The circuit shown in FIG. 1 is also provided with a PLL circuit 14, 15, 16 having a reference oscillator 14 generating a reference frequency $f_{ref}$, a comparison stage 15 and a frequency divider 16. The output signal of the oscillator 10 having the frequency $f_1$ is supplied to the frequency divider 16, which divides the frequency fed into it by a predetermined number, for example by 8 for an input frequency of 160 MHz. The frequency $f_1$ of the output signal of the oscillator 10 which is divided downward by the frequency divider 16, is fed together with the reference signal $f_{ref}$ into the comparison stage 15, which generates an output signal corresponding to the difference between the two input frequencies.

According to the invention, the two oscillators 10 and 11 are thus regulated in common by the frequency comparison output signal of the comparison stage 15, through the respective frequency-determining circuit portions Id1 and Id2. The result is two quartz-stable frequencies $f_1$ and $f_2$, which can be defined closely adjacent one another by means of a frequency-determining circuit portion of the oscillators.

Figure 2:
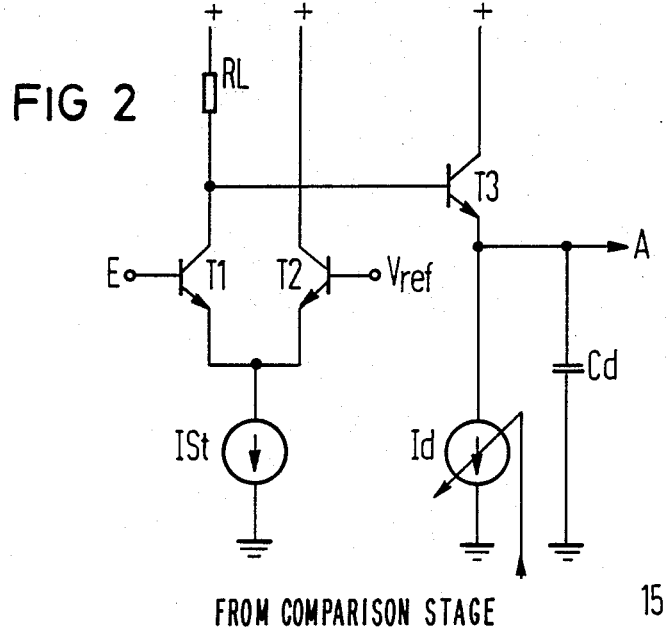
FIG. 2 is a schematic circuit diagram of a basic cell for a ring oscillator, which is particularly well suited for the realization of oscillators in the circuit of FIG. 1.

According to a further feature of the invention the oscillators 10 and 11 of FIG. 1 are preferably constructed of ring oscillators formed of ECL inverters. A basic cell for such a ring oscillator is shown in FIG. 2. In principle, such a device is formed of a differential amplifier stage and an emitter follower stage connected to the output thereof. A complete ring oscillator can be formed from a plurality of such cascade-connected cells, which are fed back from the output of the last cell to the input of the first cell.

The differential amplifier stage is formed of two emitter-coupled transistors $T_1$ and $T_2$, the interconnected emitters of which are applied to a current source ISt. A load resistor RL is connected in the collector branch of the transistor T1, so that the connection point of the collector of the transistor T1 and of the load resistor RL forms the output of the differential amplifier stage. An input E of the differential amplifier stage is formed by the base of the transistor T1, while a reference voltage $V_{ref}$ is applied to the base of the transistor T2.

The emitter follower stage is formed by a transistor T3, having a base connected to the output of the differential amplifier stage and an emitter forming an output A of the ECL inverter. A controllable current source Id, which can for example be constructed as a controllable current mirror, is located in the emitter branch of the emitter follower stage T3. The controllable current source Id and a delay capacitor Cd, which is also located at the emitter of the emitter follower stage T3, together form a frequency- determining portion of the ECL inverter. The discharge time of the delay capacitor Cd is determined by the current source Id, which is controlled by the comparison stage 15 of FIG. 1, so that the steepness of a trailing edge of the output signal of the ECL inverter directly depends on the current in the emitter branch of the emitter follower stage T3.

In an integrated circuit, the oscillators 10 and 11 of FIG. 1, which are constructed as ring oscillators in the sense described above, are identically constructed electrically and geometrically except for the size of the delay capacitor Cd, and are strictly symmetrical. Thus, for both ring oscillators, the PLL circuit 14, 15, 16 of FIG. 1 permits process parameter variations as well as temperature and supply voltage dependencies to be stabilized by means of a single PLL circuit.

As already indicated above, the dissimilar oscillating frequency of the two ring oscillators 10 and 11 is only attained by means of the intentional deviation of a frequency-determining variable or of a frequency-determining circuit portion in a ring oscillator. The size of the delay capacitor Cd of FIG. 2 is suitably utilized for this purpose, because this is highly feasible from the manufacturing standpoint.

The foregoing is a description corresponding in substance to German Application P 37 30 645.6, dated Sept. 11, 1987, the International priority of which is being claimed for the instant application, and which is hereby made part of this application. Any material discrepancies between the foregoing specification and the aforementioned corresponding German application are to be resolved in favor of the latter.

What is claimed is:

1. Circuit for generating two closely adjacent frequencies, comprising two oscillators each generating one of two closely adjacent frequencies, and a PLL circuit connected to said oscillators for regulating the frequencies, said PLL circuit including means for performing a frequency comparison of the frequency generated by only one of said oscillators with a reference frequency to generate a frequency comparison output signal of said PLL circuit, and for regulating the frequencies of both of said oscillators as a function of the frequency comparison output signal of said PLL circuit; wherein said oscillators are ring oscillators formed by ECL inverters; including means for defining the frequencies of said ring oscillators formed by ECL inverters with a dissimilar value of a frequency-determining magnitude, and means for regulating the frequencies by adjusting the value of the frequency-determining magnitude through the frequency comparison output signal of the PLL circuit.

2. Circuit according to claim 1, wherein said ring oscillators have an emitter follower with a delay capacitor forming the frequency-determining magnitude, and the regulation by the frequency comparison output signal of the PLL circuit is in the form of a regulation of the current of said emitter follower.

3. Circuit according to claim 2, wherein said ring oscillators are electrically and geometrically identical and symmetrical in an integrated circuit.

* * * * *